(12) United States Patent
Nishita et al.

(10) Patent No.: US 12,308,608 B2
(45) Date of Patent: May 20, 2025

(54) SEMICONDUCTOR OPTICAL INTEGRATED DEVICE

(71) Applicant: FURUKAWA ELECTRIC CO., LTD., Tokyo (JP)

(72) Inventors: Masayoshi Nishita, Tokyo (JP); Hiroyuki Ishii, Tokyo (JP); Toshihito Suzuki, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 899 days.

(21) Appl. No.: 17/401,190

(22) Filed: Aug. 12, 2021

(65) Prior Publication Data

US 2021/0376558 A1 Dec. 2, 2021

Related U.S. Application Data

(63) Continuation of application No. PCT/JP2020/004876, filed on Feb. 7, 2020.

(30) Foreign Application Priority Data

Feb. 14, 2019 (JP) ................................. 2019-024939

(51) Int. Cl.
*H01S 5/00* (2006.01)
*H01S 5/026* (2006.01)
(Continued)

(52) U.S. Cl.
CPC .......... *H01S 5/026* (2013.01); *H01S 5/06256* (2013.01); *H01S 5/06817* (2013.01);
(Continued)

(58) Field of Classification Search
CPC .. H01S 5/026; H01S 5/06256; H01S 5/06817; H01S 5/1092; H01S 5/1209; H01S 5/142; H01S 5/2018; H01S 5/50
See application file for complete search history.

(56) References Cited

U.S. PATENT DOCUMENTS

2006/0269190 A1* 11/2006 Kim ........................ H01S 5/141
385/14
2010/0103963 A1 4/2010 Fujiwara et al.
(Continued)

FOREIGN PATENT DOCUMENTS

CN 2904401 Y 5/2007
CN 102637997 A 8/2012
(Continued)

OTHER PUBLICATIONS

International Search Report issued Apr. 21, 2020 in PCT/JP2020/004876 filed Feb. 7, 2020, citing documents AA-AC & AP-AR therein, 3 pages.
(Continued)

*Primary Examiner* — Kinam Park
(74) *Attorney, Agent, or Firm* — Oblon, McClelland, Maier & Neustadt, L.L.P.

(57) ABSTRACT

A semiconductor optical integrated device in which a forward-bias optical device and a semiconductor laser are monolithically integrated on a semiconductor substrate, includes: a passive waveguide portion that is arranged between the forward-bias optical device and the semiconductor laser; and a ground electrode that is arrange on a lower surface of the semiconductor substrate. Further, the semiconductor laser includes a mirror having a length on a side closer to the forward-bias optical device, the forward-bias optical device includes a forward-bias optical-device electrode on a side opposite to a side in contact with the semiconductor substrate, the passive waveguide portion includes a passive waveguide electrode on a side opposite to a side in contact with the semiconductor substrate, and the passive waveguide electrode is electrically connected to the ground electrode.

6 Claims, 16 Drawing Sheets

(51) Int. Cl.
  *H01S 5/0625* (2006.01)
  *H01S 5/068* (2006.01)
  *H01S 5/10* (2021.01)
  *H01S 5/12* (2021.01)
  *H01S 5/14* (2006.01)
  *H01S 5/20* (2006.01)
  *G02B 6/12* (2006.01)
  *H01S 5/50* (2006.01)

(52) U.S. Cl.
  CPC .......... *H01S 5/1092* (2013.01); *H01S 5/1209* (2013.01); *H01S 5/142* (2013.01); *H01S 5/2018* (2013.01); *G02B 6/12* (2013.01); *H01S 5/50* (2013.01)

(56) References Cited

U.S. PATENT DOCUMENTS

| | | | | |
|---|---|---|---|---|
| 2013/0208751 | A1* | 8/2013 | Nakahara | H01S 5/12 372/45.011 |
| 2015/0010033 | A1* | 1/2015 | Davies | H01S 5/06256 372/50.11 |
| 2015/0103858 | A1* | 4/2015 | Yoshida | H01S 5/227 372/45.01 |
| 2018/0026426 | A1* | 1/2018 | Kawakita | H01S 5/0687 372/20 |
| 2018/0090576 | A1 | 3/2018 | Kim | |
| 2021/0234332 | A1* | 7/2021 | Shindo | H01S 5/026 |

FOREIGN PATENT DOCUMENTS

| | | |
|---|---|---|
| CN | 107275925 A | 10/2017 |
| JP | 2016-178283 A | 10/2016 |
| JP | 2017-28231 A1 | 2/2017 |
| JP | 2017-161830 A | 9/2017 |
| JP | 2017-527121 A | 9/2017 |

OTHER PUBLICATIONS

Japanese Office Action issued Oct. 10, 2023 in Japanese Patent Application No. 2020-572223 (with unedited computer-generated English translation), 11 pages.

Combined Office Action and Search Report issued on Jul. 29, 2023 in Chinese Patent Application No. 202080013809.1 (with English translation of Office Action), citing references 15-17 therein, 13 pages.

* cited by examiner

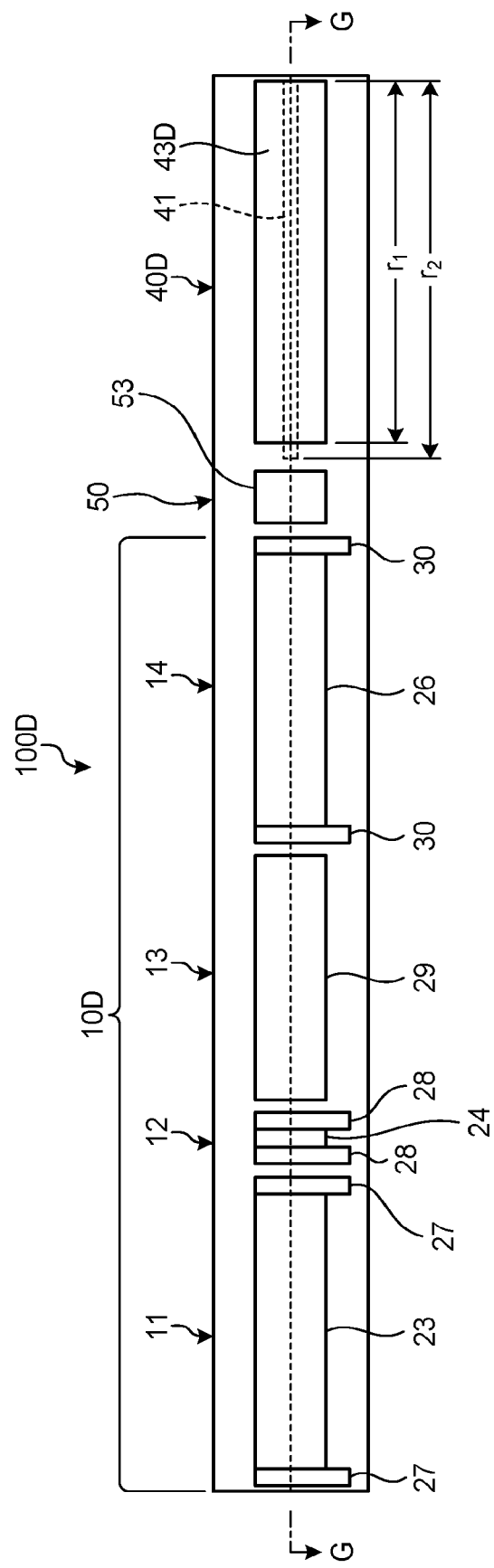

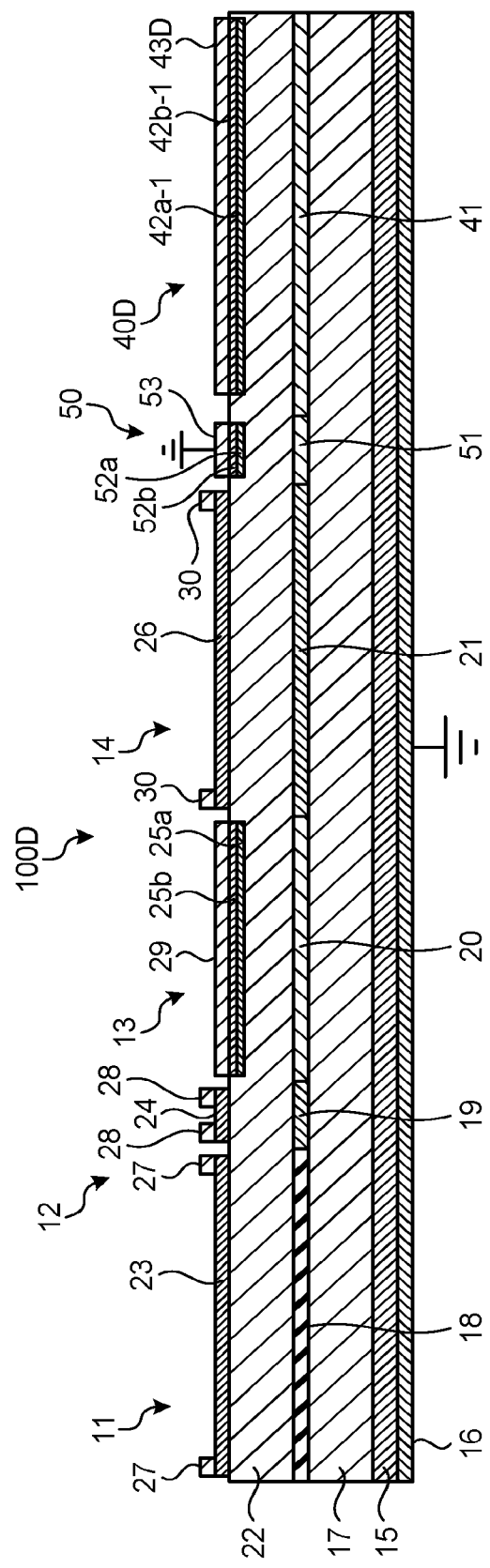

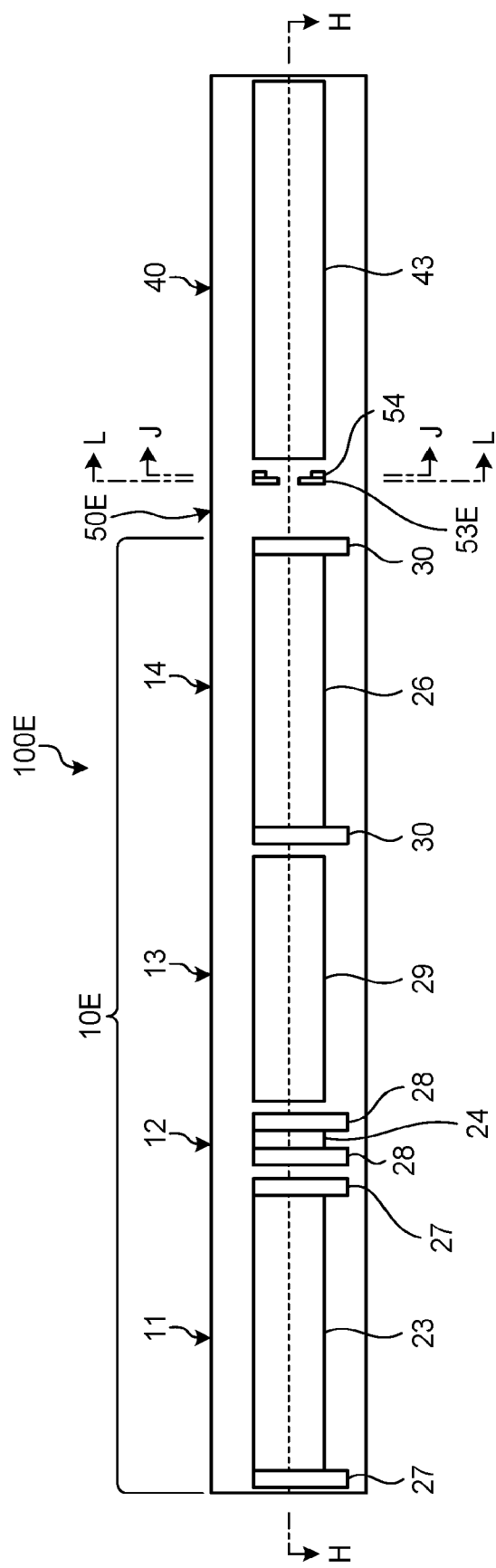

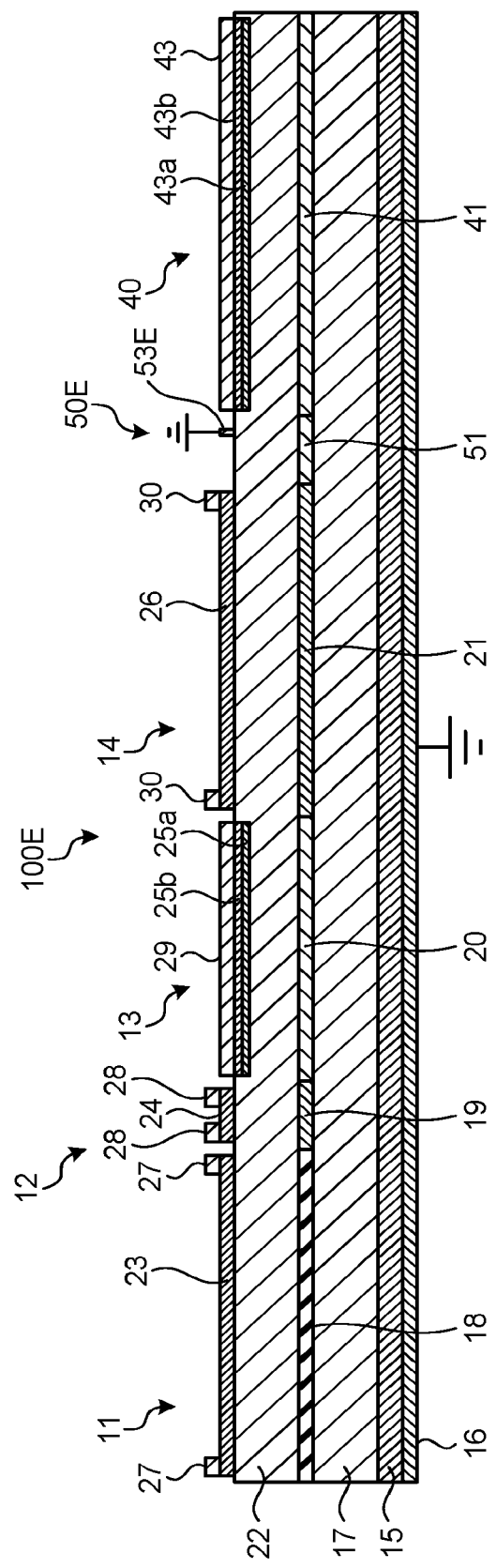

SEMICONDUCTOR OPTICAL INTEGRATED DEVICE

CROSS-REFERENCE TO RELATED APPLICATION(S)

This application is a continuation of International Application No. PCT/JP2020/004876, filed on Feb. 7, 2020 which claims the benefit of priority of the prior Japanese Patent Application No. 2019-024939, filed on Feb. 14, 2019, the entire contents of which are incorporated herein by reference.

BACKGROUND

The present disclosure relates to a semiconductor optical integrated device.

With the spread of the coherent optical communication, there is a growing demand for wavelength-tunable laser devices, an oscillated laser beam of which has a narrow spectrum width. As one of the wavelength-tunable laser devices, a distributed bragg reflector (DBR) wavelength-tunable laser that uses a sampled grating, and that uses the vernier effect has been available (for example, Japanese Laid-open Patent Publication No. 2017-161830 and Japanese Unexamined Patent Publication No. 2017-527121). In this wavelength-tunable laser device, two DBR mirrors in which a part of a diffraction grating is sampled are used in a semiconductor device. Reflection spectra of these two DBR mirror have comb-shaped peaks, cycles of which are slightly different from each other. Moreover, by injecting an electric current or heat to the DBR mirrors, to cause a change in refractive index, it is possible to make the reflection wavelength characteristics variable. By superimposing reflection peaks of the two DBR mirrors with each other, a resonator can be formed at this superimposed wavelength. In this case, by designing a resonator length appropriately, an interval of a longitudinal mode, which is a resonator mode, becomes at the same level as a band of the reflection peak of the two DBR mirrors so that only one resonator mode is selected, and a single mode oscillation is implemented.

SUMMARY

There is a need for providing a semiconductor optical integrated device in which a flow of a leakage current from the forward-bias optical device of the semiconductor amplifier or the like into a mirror is suppressed, and broadening of the spectrum width can be prevented.

According to an embodiment, a semiconductor optical integrated device in which a forward-bias optical device and a semiconductor laser are monolithically integrated on a semiconductor substrate, includes: a passive waveguide portion that is arranged between the forward-bias optical device and the semiconductor laser; and a ground electrode that is arrange on a lower surface of the semiconductor substrate. Further, the semiconductor laser includes a mirror having a length on a side closer to the forward-bias optical device, the forward-bias optical device includes a forward-bias optical-device electrode on a side opposite to a side in contact with the semiconductor substrate, the passive waveguide portion includes a passive waveguide electrode on a side opposite to a side in contact with the semiconductor substrate, and the passive waveguide electrode is electrically connected to the ground electrode.

BRIEF DESCRIPTION OF THE DRAWINGS

FIG. 10 is a schematic top view of a wavelength-tunable laser device according to a fourth embodiment;

FIG. 11 is a cross-section taken along a line G-G of the wavelength-tunable laser device illustrated in FIG. 10;

FIG. 12 is a schematic top view of a wavelength-tunable laser device according to a fifth embodiment;

FIG. 13 is a cross-section taken along a line H-H of the wavelength-tunable laser device illustrated in FIG. 12;

DETAILED DESCRIPTION

In the techniques disclosed in Japanese Laid-open Patent Publication No. 2017-161830 and Japanese Unexamined Patent Publication No. 2017-527121, a semiconductor optical amplifier is arranged outside a laser cavity, and a leakage current from the semiconductor amplifier flows into a waveguide portion of a DBR mirror adjacent thereto, and the reflective index of the DBR mirror changes. This has been causing a problem that the spectrum width is broadened.

Hereinafter, embodiments will be explained in detail with reference to the drawings. The embodiments are not intended to limit the present disclosure. Moreover, common reference signs are appropriately assigned to identical or corresponding components throughout the drawings. Furthermore, the drawings show schematic illustrations, and it is noted that a relationship among respective components, a ratio among the respective components can differ from those in actual situations. Also among the drawings, portions in which a relationship in dimensions thereamong or ratios are different can be included. Moreover, xyz coordinate axes are appropriately shown in some of the drawings, and directions will be explained based on those.

First Embodiment

Figure 1:
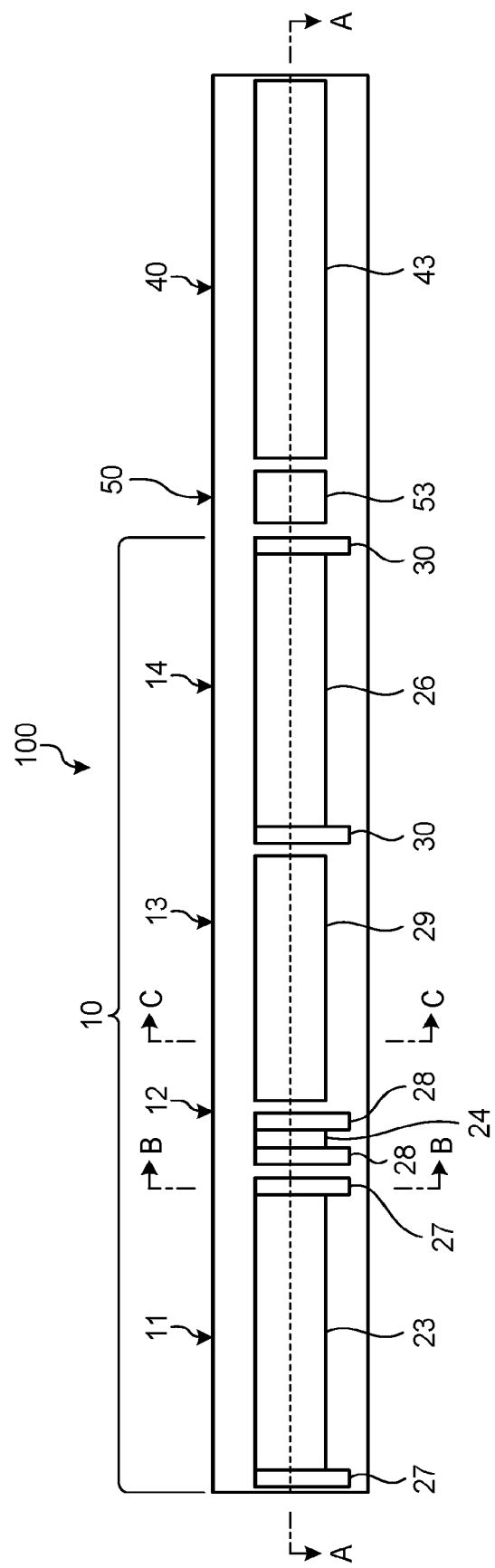
FIG. 1 is a schematic top view of a wavelength-tunable laser device according to a first embodiment.
Figure 2:
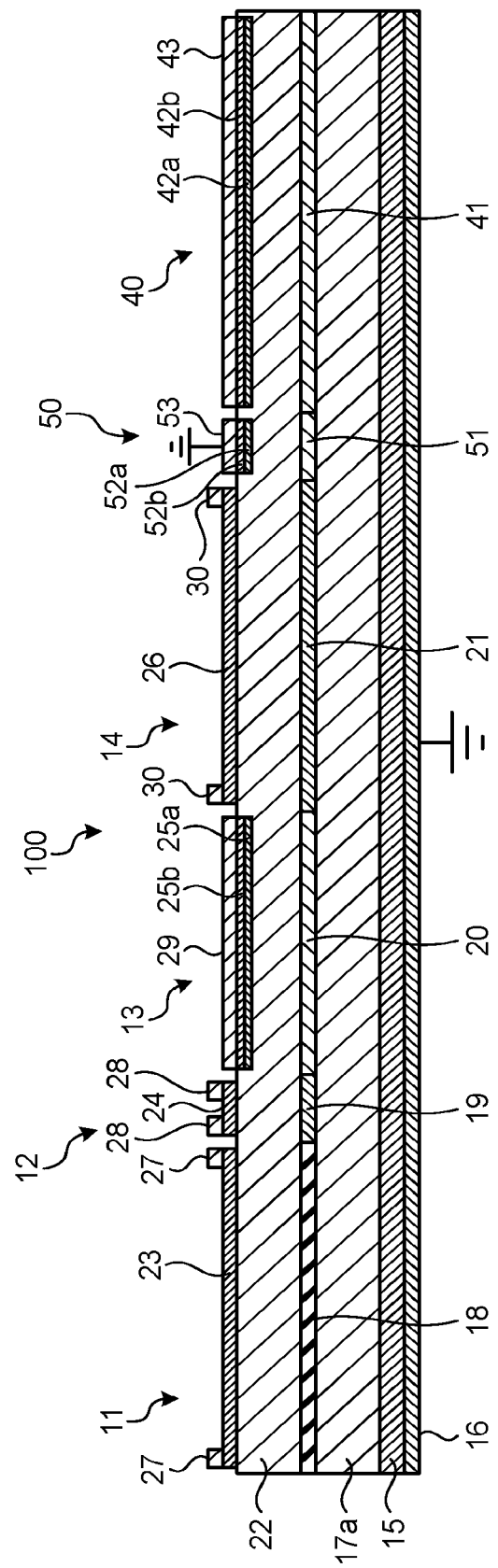
FIG. 2 is a cross-section taken along a line A-A of the wavelength-tunable laser device illustrated in FIG. 1.
Figure 3:
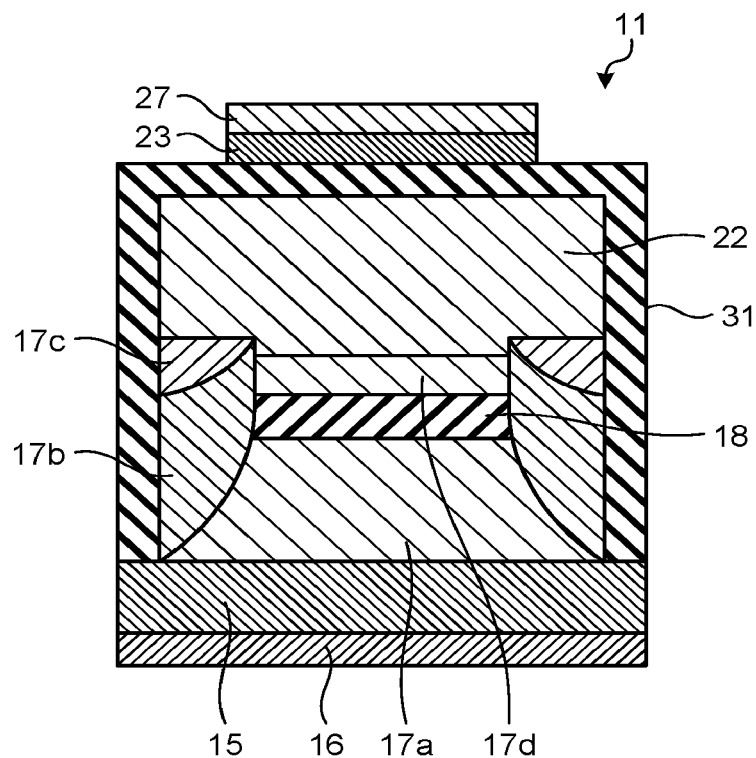
FIG. 3 is a cross-section taken along a line B-B of the wavelength-tunable laser device illustrated in FIG. 1.
Figure 4:
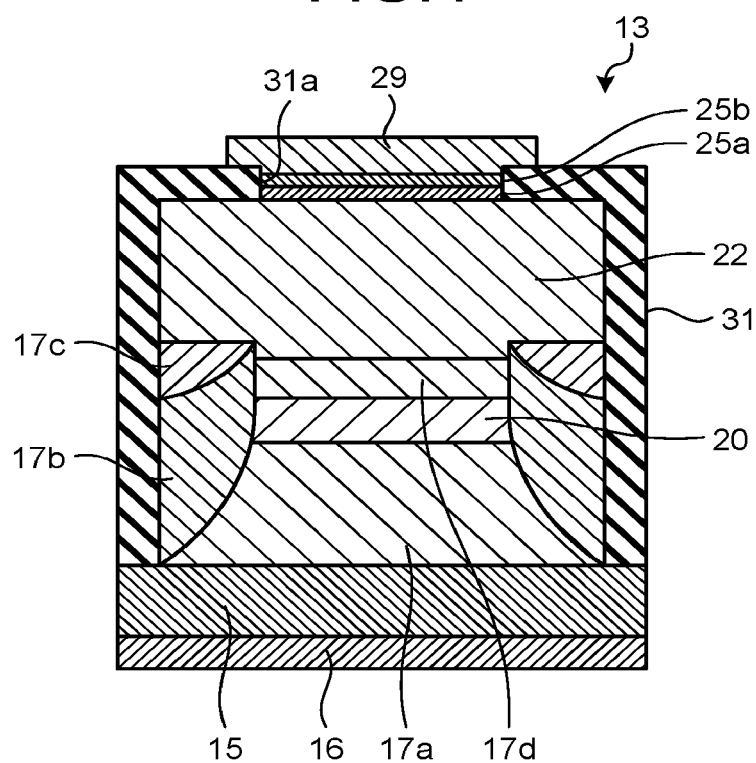
FIG. 4 is a cross-section taken along a line C-C of the wavelength-tunable laser device illustrated in FIG. 1.

FIG. 1 is a schematic top view of a wavelength-tunable laser device 100 according to a first embodiment, FIG. 2 is a cross-section taken along a line A-A of the wavelength-tunable laser device 100 illustrated in FIG. 1, FIG. 3 is a cross-section taken along a line B-B of the wavelength-tunable laser device 100 illustrated in FIG. 1, and FIG. 4 is a cross-section taken along a line C-C of the wavelength-tunable laser device 100 illustrated in FIG. 1. In FIG. 2, illustration of some components (protection film, spacer layer) is omitted.

The wavelength-tunable laser device 100 is a semiconductor optical integrated device in which a semiconductor laser 10, a semiconductor optical amplifier (SOA) 40, which is a forward-bias optical device, and a passive waveguide portion 50 are monolithically integrated on an upper surface of a semiconductor substrate 15. In the present specification, a forward-bias optical device signifies a device that applies an electric current to be flown from an electrode arranged above a forward bias electrode to an electrode arranged therebelow.

The semiconductor laser 10 includes a first sampled grating distributed bragg reflector (SG-DBR) 11 that is a mirror having a length, a phase adjusting portion 12, a gain portion 13, and a second SG-DBR 14. The first SG-DBR 11, the phase adjusting portion 12, the gain portion 13, and the second SG-DBR 14 are connected in this sequence.

The first SG-DBR 11 has a structure in which a second reflecting portion and a wavelength filter are formed into one piece. In the first SG-DBR 11, as illustrated in FIG. 3, for example, a lower cladding layer 17a made from n-type InP, an optical waveguide layer 18 having a DBR diffraction grating layer, a spacer layer 17d made from p-type InP, and an upper cladding layer 22 made from p-type InGaAsP are sequentially laminated on a main surface of the semiconductor substrate 15 made from n-type InP, and a microheater 23 that is a resistance heater including Ti in an upper portion, and a pad electrode 27 including AuZn are arranged through a protection film 31 made from SiN or the like. The first SG-DBR 11 can adjust wavelength characteristics by variation of the refractive index of the optical waveguide layer 18 caused by application of heat of the microheater 23.

The optical waveguide layer 18 and the spacer layer 17d have a stripe mesa structure formed to have a width (for example, 1.8 μm) suitable for optically propagating light of 1.55 μm waveband in a single mode by etching or the like. On both sides of the stripe mesa structure (left and right directions on the sheet), a current blocking structure constituted of a p-type InP buried layer 17b and an n-type InP current blocking layer 17c is formed. The optical waveguide layer 18 has a structure in which a sampled grating is formed along a z direction in a p-type InGaAsP layer, and a groove of the diffraction grating is filled with InP. In the optical waveguide layer 18, grating intervals of the diffraction grating are uniform but sampled, and thus shows a substantially periodic reflection response to a wavelength.

The phase adjusting portion 12 is arranged between the first SG-DBR 11 and the second SG-DBR 14. In the phase adjusting portion 12, a lower cladding layer 17a, an optical waveguide layer 19 made from InGaAsP, the spacer layer 17d, and an upper cladding layer 22 are sequentially laminated on the main surface of the semiconductor substrate 15, and a microheater 24 that is a resistance heater including Ti on an upper portion, and a pad electrode 28 including AuZn are arranged through the protection film 31. A cross-section of the phaser adjusting portion has a structure in which the optical waveguide layer 18 having DBR diffraction grating layer of the first SG-DBR 11 illustrated in FIG. 3 is replaced with the optical waveguide layer 19.

The gain portion 13 is arranged between the first SG-DBR 11 and the second SG-DBR 14, and exerts an optical amplification function by being supplied with a driving electric current. In the gain portion 13, the lower cladding layer 17a, an active core layer 20 made from InGaAsP, the spacer layer 17d, and the upper cladding layer 22 are sequentially laminated on the main surface of the semiconductor substrate 15, and a pad electrode 29 including AuZn is arranged above the upper cladding layer 22 through a contact layer 25a and an ohmic electrode 25b. The contact layer 25a and the ohmic electrode 25b are arranged at an opening portion 31a formed in the protection film 31. The active core layer 20 and the spacer layer 17d have a stripe mesa structure formed to have a width (for example, 1.8 μm) suitable for optically propagating light of 1.55 μm waveband in a single mode by etching or the like, and on both sides of the stripe mesa structure (left and right directions on the sheet), a buried structure having a current blocking structure constituted of the p-type InP buried layer 17b and the n-type InP current blocking layer 17c is formed.

The second SG-DBR 14 has a structure in which a first reflecting portion from which laser light is output and a wavelength filter are formed into one piece. In the second SG-DBR 14, the lower cladding layer 17a, an optical waveguide layer 21 having a DBR diffraction grating layer, the spacer layer 17d, and the upper cladding layer 22 are sequentially laminated on the main surface of the semiconductor substrate 15, and a microheater 26, and a pad electrode 30 including AuZn are arranged through the protection film 31 made from SiN or the like. The optical waveguide layer 21 has a structure in which a sampled grating is formed along the z direction in a p-type InGaAsP layer, and a groove of the diffraction grating is filled with InP, similarly to the optical waveguide layer 18. A cross-section of the second SG-DBR 14 is identical to that of the first SG-DBR 11 in FIG. 3. In the optical waveguide layer 21, grating intervals of the diffraction grating are uniform but sampled, and thus shows a substantially periodic reflection response to a wavelength. The second SG-DBR 14 can adjust wavelength characteristics by variation of the refractive index of the optical waveguide layer 21 caused by application of heat of the microheater 26. The first SG-DBR 11 and the second SG-DBR 14 constitute a laser resonator. The first SG-DBR 11 and the second SG-DBR 14 have periodic reflection peaks, wavelength intervals of which differ from each other, as wavelength characteristics.

The SOA 40 is arranged on a laser light output side of the second SG-DBR 14 on the semiconductor substrate 15 through the passive waveguide portion 50 described later. In the SOA 40, the lower cladding layer 17a, an active core layer 41, the spacer layer 17d, and the upper cladding layer 22 are sequentially laminated on the semiconductor substrate 15, and a pad electrode including AuZn is arranged above the upper cladding layer 22 through a contact layer 42a and an ohmic electrode 42b. The contact layer 42a and the ohmic electrode 42b are arranged in the opening portion 31a formed with the protection film 31 made from SiN or the like. A cross-section of the SOA 40 is identical to that of the gain portion 13 illustrated in FIG. 4. The SOA 40 is supplied with a driving current, and thereby amplifies laser light output from the second SG-DBR 14, to be output as high-output laser light from an end surface of the wavelength-tunable laser device 100.

The wavelength of the laser light is, for example, within a wavelength range of 1.55 μm. To suppress edge reflection of laser light, it is preferable that an antireflection coat be applied on an end surface. In the wavelength-tunable laser device 100, it is only necessary to apply the antireflection coat on an end surface on the side of the SOA 40 and, therefore, the number of coating process can be reduced.

Moreover, to further suppress the edge reflection, it is preferable that the active core layer 41 of the SOA 40 be inclined near the end surface by several degrees, typically, by 7° relative to the normal of the end surface.

The passive waveguide portion 50 is arranged between the second SG-DBR 14 and the SOA 40, and connects the semiconductor laser 10 and the SOA 40 with an optical waveguide layer 51. In the passive waveguide portion 50, the lower cladding layer 17a, an optical waveguide layer 51 made from InGaAsP, the spacer layer 17d, and the upper cladding layer 22 are sequentially laminated on the main surface of the semiconductor substrate 15, and a passive waveguide electrode 53 including AuZn are arranged above the upper cladding layer 22 through a contact layer 52a and an ohmic electrode 52b. The contact layer 52a and the ohmic electrode 52b are arranged in the opening portion 31a formed with the protection film 31 made from SiN or the like. A cross-section of the passive waveguide portion 50 has a structure in which the gain portion 13 and the active core layer 20 illustrated in FIG. 4 are replaced with the optical waveguide layer 51.

On a rear surface of the semiconductor substrate 15, a ground electrode 16 that is an n-side electrode is formed. The ground electrode 16 is structured including AuGeNi, and is in ohmic contact with the semiconductor substrate 15. The pad electrode 19 of the gain portion 13, a pad electrode 43 of the SOA 40, and the passive waveguide electrode 53 are p-side electrodes, and the passive waveguide electrode 53 is electrically connected to the ground electrode 16. With the above structure, current injection to the active core layer 20 of the gain portion 13 from the ground electrode 16 and the pad electrode 29, current injection to the active core layer 41 of the SOA 40 from the ground electrode 16 and the pad electrode 43 are enabled.

In the wavelength-tunable laser device 100, by adjusting the wavelength characteristics of the first SG-DBR 11 and the second SG-DBR 14 by the microheaters 24, 26, a wavelength of laser light can be adjusted, and it functions as a vernier-type wavelength-tunable laser device.

In the SOA 40, an electric current is injected to the active core layer 41 from the ground electrode 16 and the pad electrode 43, and a leakage current from the SOA 40 flows into the optical waveguide layer 21 of the second SG-DBR 14 through the upper cladding layer 22, to thereby change the refractive index of the optical waveguide layer 21. Accordingly, the reflection phase of the second SG-DBR 14 can vary, to broaden the spectrum width. Moreover, in the wavelength-tunable laser device 100 including the SOA 40, because adjustment of an optical power is performed by using the SOA, a leakage current amount can also fluctuate according to an optical power, and the spectrum width can vary according to the optical power. Furthermore, when an electric current injected to the active core layer 41 of the SOA 40 fluctuates due to some external factors, an amount of leakage current also varies, and the spectrum width can be broadened.

In the first embodiment, the passive waveguide portion 50 is arranged between the second SG-DBR 14 and the SOA 40, and a leakage current from the SOA 40 can be flown to the ground electrode 16 through the passive waveguide electrode 53. Therefore, it is possible to suppress broadening of the spectrum width caused by a leakage current.

Although an SOA is explained as an example of a forward-bias optical device in the first embodiment, it is not limited thereto. As a forward-bias optical device, a current-injection-type filter may be used in place of the SOA.

Second Embodiment

Figure 5:
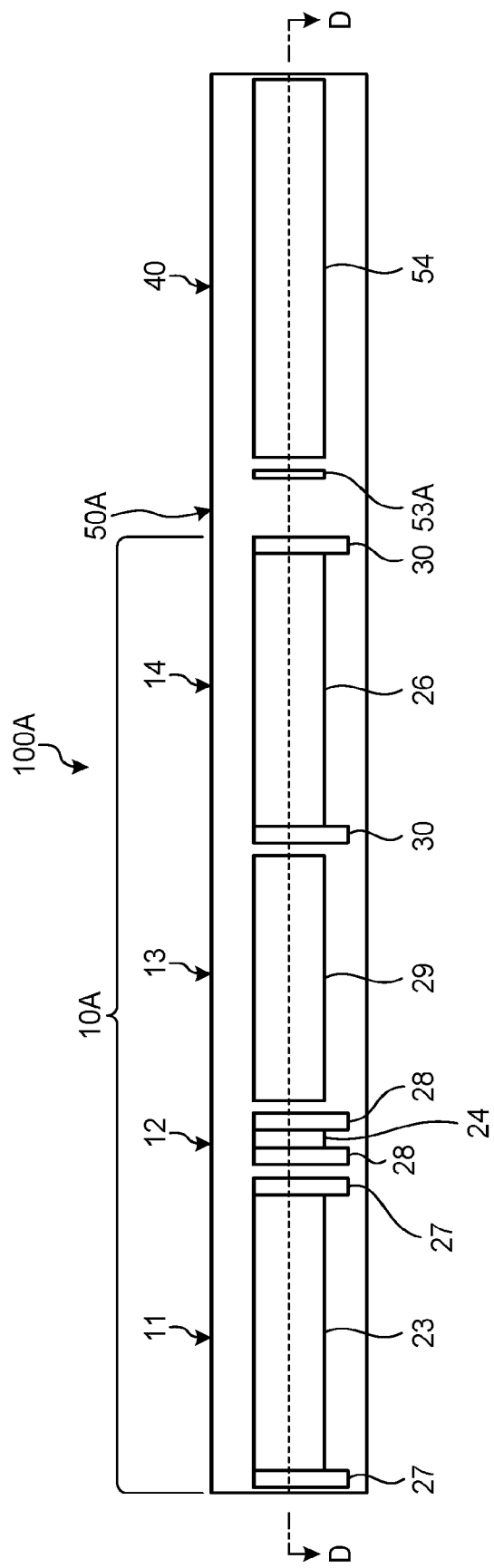
FIG. 5 is a schematic top view of a wavelength-tunable laser device according to a second embodiment.
Figure 6:
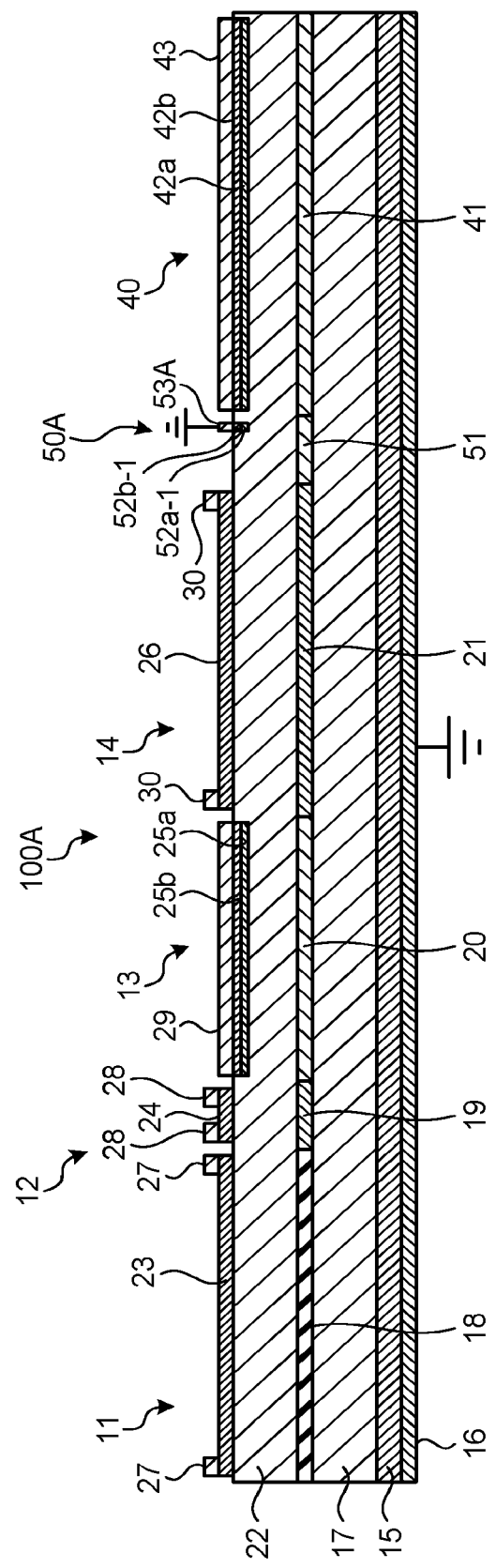
FIG. 6 is a cross-section taken along a line D-D of the wavelength-tunable laser device illustrated in FIG. 5.

FIG. 5 is a schematic top view of a wavelength-tunable laser device 100A according to a second embodiment, and FIG. 6 is a cross-section taken along a line D-D of the wavelength-tunable laser device 100A illustrated in FIG. 5. In FIG. 6, illustration of some components (protection film, spacer layer) is omitted. In the wavelength-tunable laser device 100A according to the second embodiment, a passive waveguide electrode 53A of a passive waveguide portion 50A is formed shorter than the length of the passive waveguide portion 50A. A contact layer 52a-1 and an ohmic electrode 52b-1 are also formed short similarly to the passive waveguide electrode 53A.

In the first embodiment, the passive waveguide portion 50 is arranged between the second SG-DBR 14 and the SOA 40, to extract a leakage current from the SOA 40, thereby suppressing broadening of the spectrum width, but because the contact layer 52a using p-type InGaAsP, the doping concentration of which is high as its material is arranged in the upper portion of the optical waveguide layer 51, a light loss caused by absorption of light by the contact layer 52a occurs. In the second embodiment, by making the length of the passive waveguide electrode 53A shorter than the length of the passive waveguide portion 50A, a light loss caused by the contact layer 52a is reduced. In the first embodiment, the passive waveguide electrode 53 is arranged in an entire length of the passive waveguide portion 50 except an electrical insulation gaps (normally, about 10 μm each) between the second SG-DBR 14 and the SOA 40. However, the passive waveguide electrode 53A of the second embodiment has a length as long as 80% of the length of the passive waveguide portion 50A, and more preferably, a length as long as 10% to 50% of the length of the passive waveguide portion 50A. In this case, the electrical insulation gaps are not included in the length of the passive waveguide portion 50A. Moreover, to extract a leakage current efficiently, it is preferable to arrange the passive waveguide electrode 53A on a side closer to the SOA 40.

In the second embodiment, similarly to the first embodiment, by extracting a leakage current from the SOA 40 by the passive waveguide electrode 53A, broadening of the spectrum width caused by the leakage current is suppressed, and because the length of the passive waveguide electrode 53A is short, a light loss can be reduced.

Third Embodiment

Figure 7:
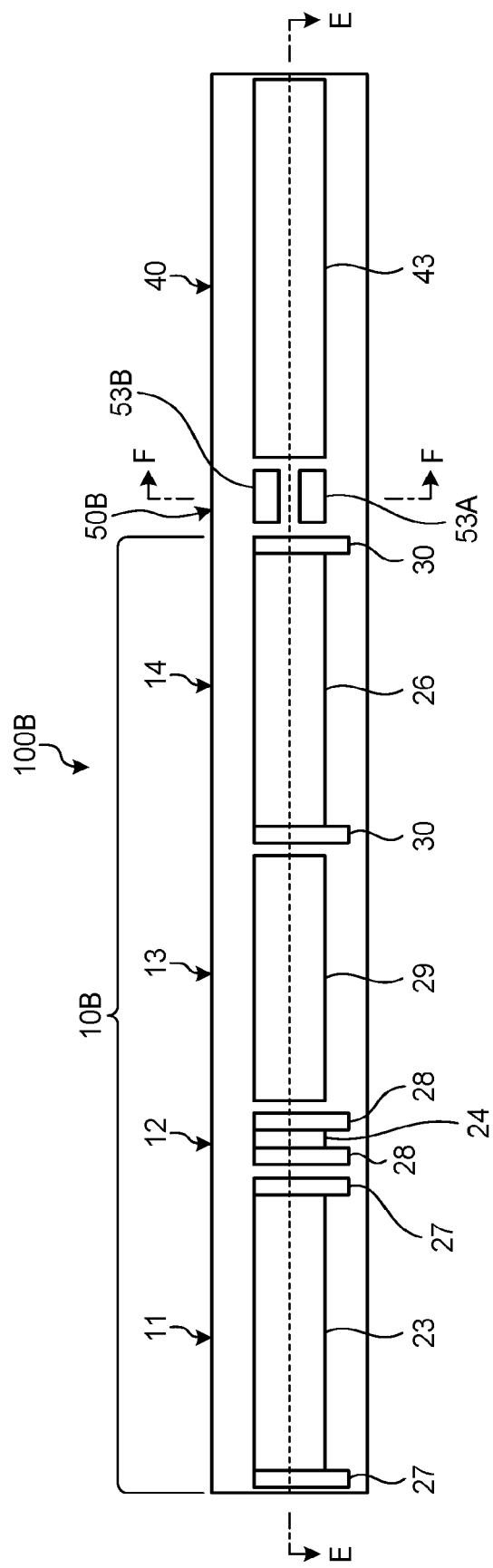
FIG. 7 is a schematic top view of a wavelength-tunable laser device according to a third embodiment.
Figure 8:
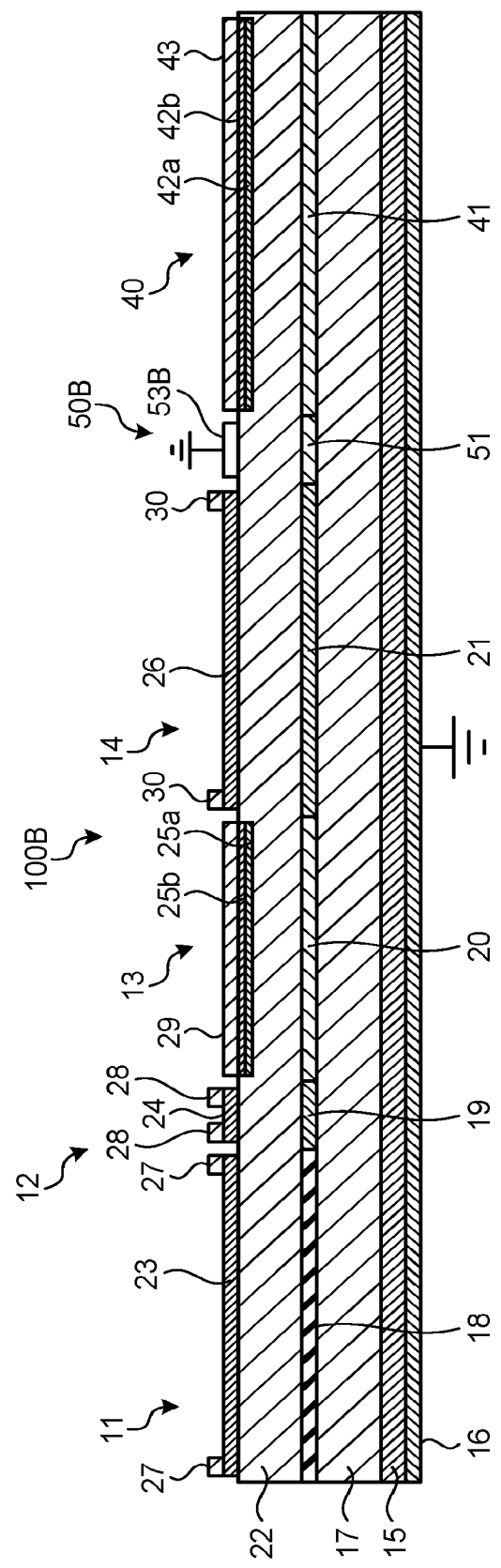
FIG. 8 is a cross-section taken along a line E-E of the wavelength-tunable laser device illustrated in FIG. 7.
Figure 9:
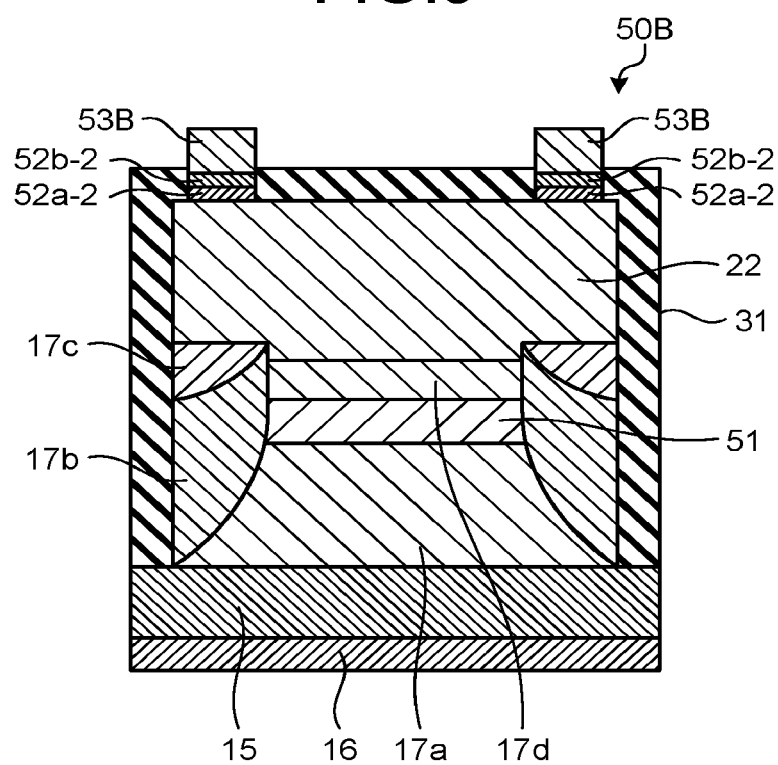
FIG. 9 is a cross-section taken along a line F-F of the wavelength-tunable laser device illustrated in FIG. 7.

FIG. 7 is a schematic top view of a wavelength-tunable laser device 100B according to a third embodiment, FIG. 8 is a cross-section taken along a line E-E of the wavelength-tunable laser device 100B illustrated in FIG. 7, and FIG. 9 is a cross-section taken along a line F-F of the wavelength-tunable laser device 100B illustrated in FIG. 7. In FIG. 9, illustration of some components (protection film, spacer layer) is omitted. In the wavelength-tunable laser device 100B according to the third embodiment, a passive waveguide electrode 53B of a passive waveguide portion 50B is arranged, avoiding a portion right above the optical waveguide layer 51. A contact layer 52a-2 and an ohmic electrode 52b-2 are also arranged, avoiding right above the optical waveguide layer 51, similarly to the passive waveguide electrode 53B.

As explained in the second embodiment, as the contact layer 52a is arranged above the optical waveguide layer 51, a light loss caused by absorption of light by the contact layer 52a occurs. In the third embodiment, the contact layer 52a-2, the ohmic electrode 52b-2, and the passive waveguide electrode 53B are formed parallel to the optical waveguide layer 51 of the passive waveguide portion 50B, and are arranged, avoiding right above the optical waveguide layer 51.

In the third embodiment, similarly to the first embodiment, by extracting a leakage current from the SOA 40 by the passive waveguide electrode 53A, broadening of the spectrum width caused by the leakage current is suppressed, and because the passive waveguide electrode 53B is arranged, avoiding right above optical waveguide layer 51, it is possible to reduce a light loss.

Fourth Embodiment

FIG. 10 is a schematic top view of a wavelength-tunable laser device 100D according to a fourth embodiment, and FIG. 11 is a cross-section taken along a line G-G of the wavelength-tunable laser device 100D illustrated in FIG. 10. In FIG. 11, illustration of some components (protection film, spacer layer) is omitted. In the wavelength-tunable laser device 100D according to the fourth embodiment, a pad electrode 43D of a SOA 40D is formed shorter than a length of the active core layer 41. The contact layer 42a-1 and the ohmic electrode 42b-1 are also formed short, similarly to the pad electrode 43D.

In the first embodiment, by extracting a leakage current from the pad electrode 43 of the SOA 40 by the passive waveguide electrode 53 of the passive waveguide portion 50, broadening of the spectrum width is suppressed. In the fourth embodiment, by reducing an amount of leakage current from the pad electrode 43 of the SOA 40, broadening of the spectrum width is further suppressed. In the wavelength-tunable laser device 100D, a length r1 of the pad electrode 43 of the SOA 40D is shorter than a length r2 of the active core layer 41, and the pad electrode 43D is not arranged above the end portion on a side closer to the passive waveguide portion 50 of the active core layer 41. However, because a portion in which the pad electrode 43D of the active core layer 41 is not arranged is to be a light absorption layer, it is preferable that a length of the portion in which the pad electrode 43D of the active core layer 41 is not arranged be equal to or shorter than 10 µm (not including electrical insulation gaps).

In the fourth embodiment, similarly to the first embodiment, by extracting a leakage current from the SOA 40 by the passive waveguide electrode 53A, broadening of the spectrum width caused by the leakage current can be suppressed, and because an amount of leakage current from the pad electrode 43D of the SOA 40D is reduced, broadening of the spectrum width can further be suppressed.

Although the passive waveguide portion 50 is adopted in the fourth embodiment, similarly to the first embodiment, the passive waveguide portion 50A of the second embodiment, or the passive waveguide portion 50B of the third embodiment may also be adopted.

Fifth Embodiment

Figure 14A:
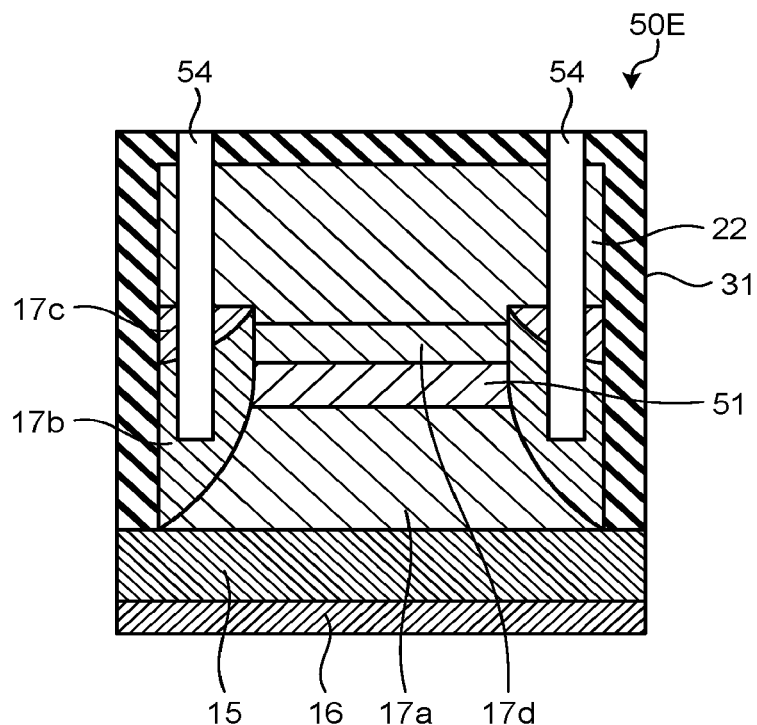
FIG. 14A is a cross-section taken along a line J-J of the wavelength-tunable laser device illustrated in FIG. 12.
Figure 14B:
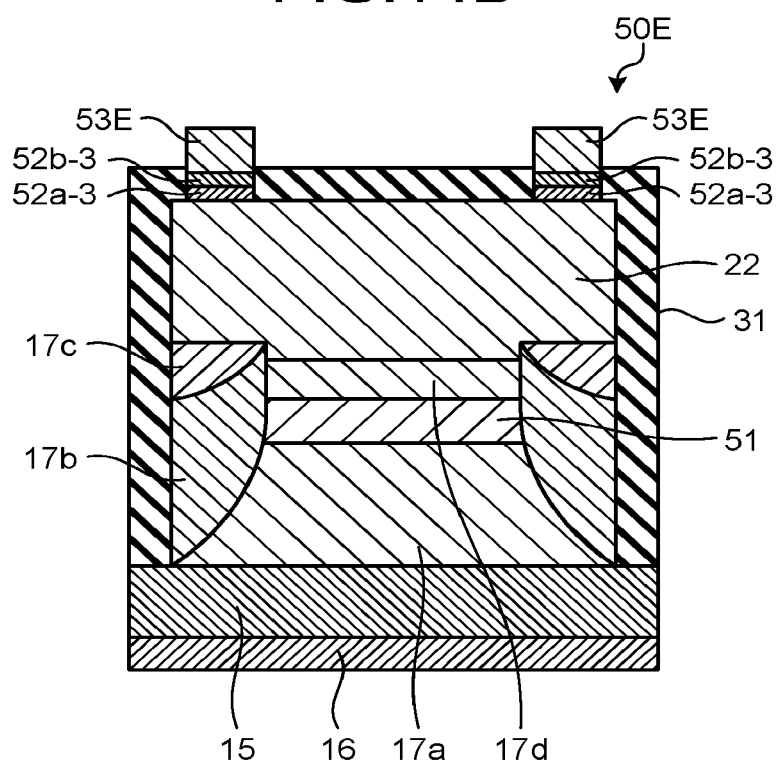
FIG. 14B is a cross-section taken along a line L-L of the wavelength-tunable laser device illustrated in FIG. 12.

FIG. 12 is a schematic top view of a wavelength-tunable laser device 100E according to a fifth embodiment, FIG. 13 is a cross-section taken along a line H-H of the wavelength-tunable laser device 100E illustrated in FIG. 12, and FIG. 14A is a cross-section taken along a line J-J (cross-section at a trench 54) of the wavelength-tunable laser device illustrated in FIG. 12. FIG. 14B is a cross-section taken along a line L-L (cross-section at a passive waveguide electrode 53E) of the wavelength-tunable laser device illustrated in FIG. 12. In FIG. 13, illustration of some components (protection film, spacer layer) is omitted. In the wavelength-tunable laser device 100E according to the fifth embodiment, the trench 54 is arranged on a side closer to the SOA 40 than the passive waveguide electrode 53E.

In the fifth embodiment, the trench 54 is formed on a side closer to the SOA 40 than the passive waveguide electrode 53E to reduce an amount of leakage current that can be injected to the second SG-DBR 14 from the SOA 40. The trench 54, a contact layer 52a-3, an ohmic electrode 52b-3, and the passive waveguide electrode 53E are arranged two each in parallel to the optical waveguide layer 51 of a passive waveguide portion 50E, and are arranged, avoiding right above the optical waveguide layer 51. Moreover, the contact layer 52a-3, the ohmic electrode 52b-3, and the passive waveguide electrode 53E are formed to have a length shorter than a length of the passive waveguide portion 50E, and are arranged adjacent to the trench portion 54. By arranging the trench 54, injection of a leakage current from the SOA 40 into the passive waveguide electrode 53E is reduced. Because a leakage current flows through the upper cladding layer 22, it is preferable that the trench 54 be arranged up to the n-type InP current blocking layer 17c through the p-type InP buried layer 17b. In the fifth embodiment, an extraction amount of leakage current by the passive waveguide electrode 53E is improved by making a width of the passive waveguide electrode 53E (length in a direction perpendicular to the optical waveguide layer 51) longer than a width of the trench 54, but it may be formed in the same length as the trench 54.

In the fifth embodiment, similarly to the first embodiment, by extracting a leakage current from the SOA 40 by the passive waveguide electrode 53E, broadening of the spectrum width caused by the leakage current can be suppressed, and because an amount of leakage current from the pad electrode 43 of the SOA 40 that can be injected can be reduced with the trench 54, broadening of the spectrum width can further be suppressed.

Sixth Embodiment

Figure 15:
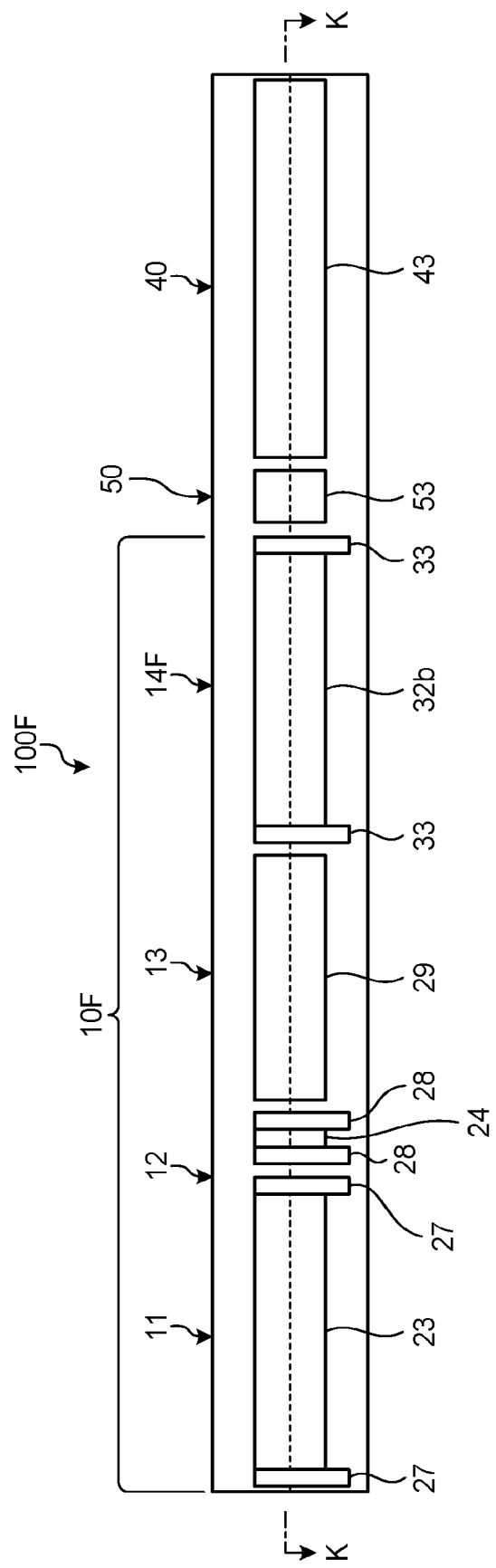
FIG. 15 is a schematic top view of a wavelength-tunable laser device according to a sixth embodiment.
Figure 16:
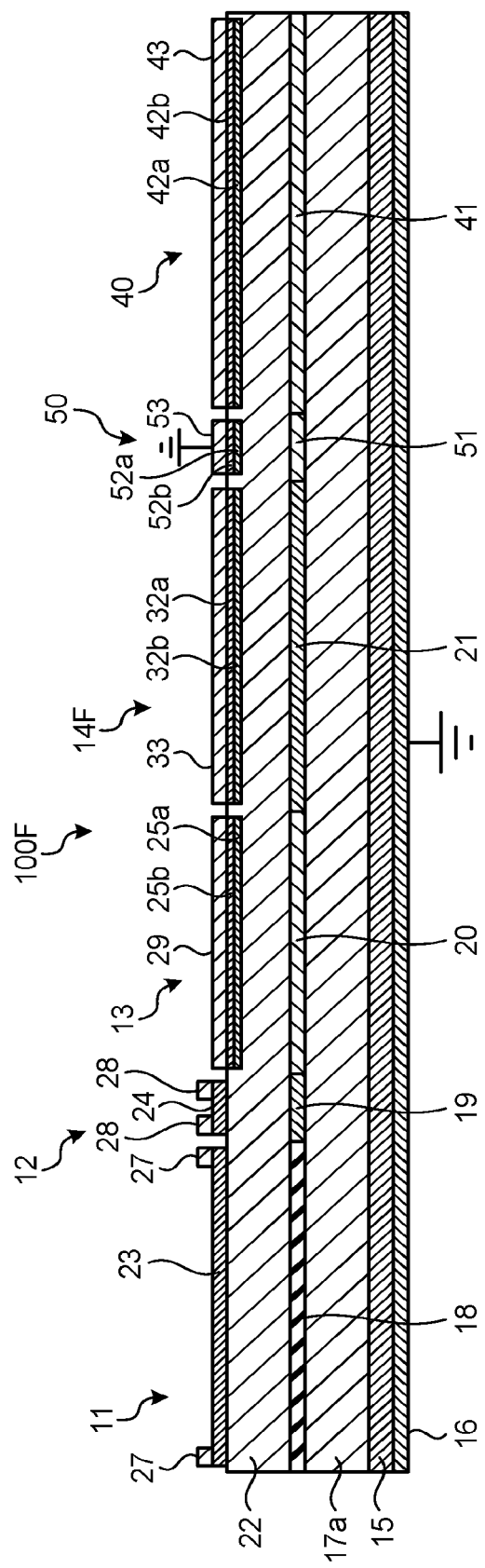
FIG. 16 is a cross-section taken along a line K-K of the wavelength-tunable laser device illustrated in FIG. 15.

FIG. 15 is a schematic top view of a wavelength-tunable laser device 100F according to a sixth embodiment, and FIG. 16 is a cross-section taken along a line K-K of the wavelength-tunable laser device 100F illustrated in FIG. 15. In FIG. 16, illustration of some components (protection film, spacer layer) is omitted. In the wavelength-tunable laser device 100F according to the sixth embodiment, a second SG-DBR 14F is of a current injection type.

In the second SG-DBR 14F, a pad electrode 33 including AuZn is arranged above the upper cladding layer 22 through a contact layer 32 and an ohmic electrode 32b, in place of the microheater 26 and the pad electrode 30 in the second SG-DBR 14 of the first embodiment. The contact layer 32a and the ohmic electrode 32b are arranged in an opening formed with the protection film 31 made from SiN or the like. In the second SG-DBR 14F, an electric current is injected to the optical waveguide layer 21 having a diffraction grating from the ground electrode 16 and the pad electrode 33. When the electric current to be injected to the optical waveguide layer 21 varies, a concentration of electrons and holes in the optical waveguide layer 21 constituting a distribution reflector varies. As a result, the refractive index varies by the carrier plasma effect, and wavelength characteristics can be changed.

When the second SG-DBR 14F is of the current injection type also, by extracting a leakage current from the SOA 40 by the passive waveguide electrode 53, broadening of the spectrum width caused by the leakage current can be suppressed.

Seventh Embodiment

Figure 17:
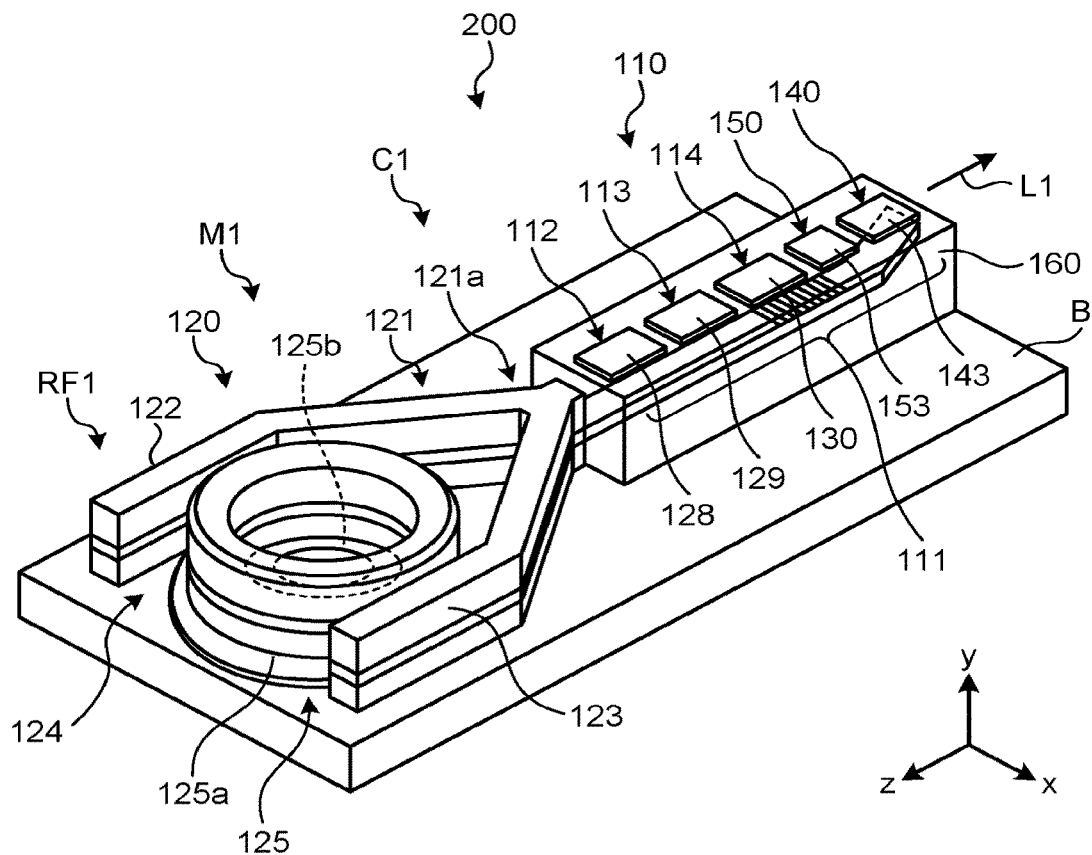
FIG. 17 is a schematic perspective view of a wavelength-tunable laser device according to a seventh embodiment.

FIG. 17 is a schematic perspective view of a wavelength-tunable laser device 200 according to a seventh embodiment. In the wavelength-tunable laser device 200, two mirrors having lengths are an SG-DBR 114 and a ring resonator filter RF1.

As illustrated in FIG. 17, the wavelength-tunable laser device 200 is configured to output laser light L1 by making laser oscillation in 1.55 µm waveband. The wavelength-tunable laser device 200 includes a first waveguide portion 110 and a second waveguide portion 120 that are formed on a common semiconductor substrate B. The semiconductor substrate B is constituted of, for example, an n-type InP substrate. On a rear surface of the semiconductor substrate B, a ground electrode is formed. The ground electrode is formed including AuGeNi, and is in ohmic contact with the semiconductor substrate B.

The first waveguide portion 110 includes a phase adjusting portion 112, a gain portion 113, the SG-DBR 114, a passive waveguide portion 150, and an SOA 140. Moreover, the first waveguide portion 110 includes a microheater 128, a pad electrode 129, a microheater 130, a passive waveguide electrode 153, and a pad electrode 143 on the phase adjusting portion 112, the gain portion 113, the SG-DBR 114, the passive waveguide portion 150, and the SOA 140. Inside the first waveguide portion 110, a waveguide portion 111 to which a waveguide layer of the phase adjusting portion 112, an active core layer of the gain portion 113, a waveguide portion having a diffraction grating of the SG-DBR 114, a waveguide layer of the passive waveguide portion 150, and an active core layer of the SOA 140 are connected is arranged. A semiconductor layered portion 160 is structured by laminating semiconductor layers, and has a function as a cladding portion and the like with respect to the waveguide portion 111.

The microheater 128, the pad electrode 129, the microheater 130, the passive waveguide electrode 153, and the pad electrode 143 are arranged along the waveguide portion 111 on the semiconductor layered portion 160. In the semiconductor layered portion 160, a $SiN_x$ protection film is formed, and the pad electrode 129, the passive waveguide electrode 153, and the pad electrode 143 are in contact with the semiconductor layered portion 160 through an opening formed with the $SiN_x$ protection film.

The second waveguide portion 120 includes a bifurcation portion 121, two arm portions 122, 123, a ring-shaped waveguide 124, and a microheater 125 made from Ti. The bifurcation portion 121 is constituted of 1×2 bifurcation waveguide including 1×2 multi-mode interference (MMI) waveguide 121a, and a two port side is connected to the respective two arm portions 122, 123, and a one port side is connected to the first waveguide portion 110. The two arm portions 122, 123 are unified at one end by the bifurcation portion 121, and is optically coupled with the waveguide portion 111.

The arm portions 122, 123 both extend in the z direction, and are arranged so as to sandwich the ring-shaped waveguide 124. The arm portions 122, 123 are adjacent to the ring-shaped waveguide 124, and are both optically coupled with the ring-shaped waveguide 124 with the same coupling coefficient κ. A value of κ is, for example, 0.2. The arm portions 122, 123, and the ring-shaped waveguide 124 constitute the ring resonator filter RF1. Moreover, the ring resonator filter RF1 and the bifurcation portion 121 constitute a reflection mirror M1. The reflection mirror M1 shows a substantially periodic reflection response to a wavelength. The microheaters 125a, 125b serving as a heating unit that applies heat to the optical waveguide are in a ring shape. The microheater 125a is arranged on an outer peripheral side of the ring-shaped waveguide 124, and the microheater 125b is arranged on an inner peripheral side. The microheaters 125a, 125b are arranged on a dielectric layer as a protection film that is formed to cover the ring-shaped waveguide 124.

The first waveguide portion 110 and the second waveguide portion 120 are optically connected to each other, and a waveguide layer having a diffraction grating of the waveguide portion 111 and the reflection mirror M1 constitutes a laser resonator C1. Moreover, the phase adjusting portion 112, the gain portion 113, the SG-DBR 114, and the second waveguide portion 120 constitutes the semiconductor laser. The ring-shaped waveguide 124 has a high mesa waveguide structure. A width of the high mesa waveguide structure is approximately 2 µm.

In the wavelength-tunable laser device 200, by adjusting wavelength characteristics of the SG-DBR 114 and the reflection mirror M1 with the microheaters 130, 125, a wavelength of laser light can be adjusted, and it functions as a vernier-type wavelength-tunable laser.

In the wavelength-tunable laser device 200, because the passive waveguide electrode 153 of the passive waveguide portion 150 can extract a leakage current from the SOA 140, broadening of the spectrum width can be prevented.

Also in the wavelength-tunable laser device 200 in which the two mirrors having lengths are the SG-DBR 114 and the ring resonator filter RF1, by arranging the passive waveguide portion 150 between the SOA 140 and the SG-DBR 114, broadening of the spectrum width caused by a leakage current can be suppressed.

Eighth Embodiment

Figure 18:
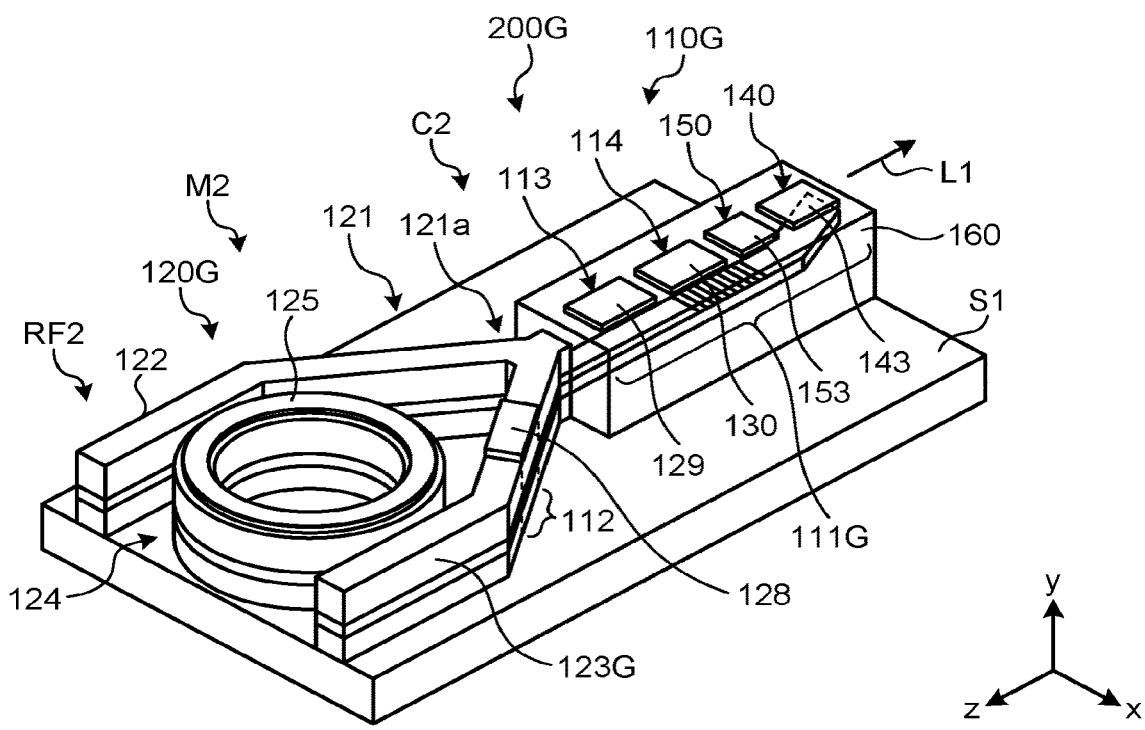
FIG. 18 is a schematic perspective view of a wavelength-tunable laser device according to an eighth embodiment

FIG. 18 is a schematic perspective view of a wavelength-tunable laser device 200G according to an eighth embodiment. In the wavelength-tunable laser device 200G, the two mirrors having lengths are the SG-DBR 114 and a ring resonator filter RF2, and the phase adjusting portion 112 is arranged in an arm portion 123G out of the two arm portions 122, 123G of the second waveguide portion 120.

As illustrated in FIG. 18, the wavelength-tunable laser device 200G is configured to output the laser light L1 by making laser oscillation in 1.55 µm waveband. The wavelength-tunable laser device 200G includes a first waveguide portion 110G and a second waveguide portion 120G that are formed on a common semiconductor substrate S1. The semiconductor substrate S1 is constituted of, for example, an n-type InP substrate. On a rear surface of the semiconductor substrate S1, a ground electrode is formed. The ground electrode is formed including, for example, AuGeNi, and is in ohmic contact with the semiconductor substrate S1.

The first waveguide portion 110G includes the gain portion 113, the SG-DBR 114, the passive waveguide portion 150, and the SOA 140. Moreover, the first waveguide portion 110G includes the pad electrode 129, the microheater 130, the passive waveguide electrode 153, and the pad electrode 143 on the gain portion 113, the SG-DBR 114, the passive waveguide portion 150, and the SOA 140. Inside the first waveguide portion 110G, the waveguide portion 111 to which an active core layer of the gain portion 113, a waveguide layer of the SG-DBR 114 having a diffraction grating, the waveguide layer of the passive waveguide portion 150, and the active core layer of the SOA 140 are connected is arranged. The semiconductor layered portion 160 is structured by laminating semiconductor layers, and has a function as a cladding portion and the like with respect to a wave guide portion 111G.

The pad electrode 129, the microheater 130, the passive waveguide electrode 153, and the pad electrode 143 are arranged along the waveguide portion 111G on the semiconductor layered portion 160. In the semiconductor layered portion 160, a $SiN_x$ protection film is formed, and the pad electrode 129, the passive waveguide electrode 153, and the pad electrode 143 are in contact with the semiconductor layered portion 160 through an opening formed with the $SiN_x$ protection film.

The second waveguide portion 120G includes the bifurcation portion 121, two arm portions 122, 123G, the ring-shaped waveguide 124, and the microheater 125 made from Ti. The bifurcation portion 121 is constituted of a 1×2 bifurcation waveguide including the 1×2 multi-mode interference (MMI) waveguide 121a, and the two port side is connected to the respective two arm portions 122, 123G, and the one port side is connected to the first waveguide portion 110G. The two arm portions 122, 123G are unified at one end by the bifurcation portion 121, and is optically coupled with the waveguide portion 111G. The arm portions 122, 123G, and the ring-shaped waveguide 124 constitute the ring resonator filter RF2. Moreover, the ring resonator filter RF2 and the bifurcation portion 121 constitute a reflection mirror M2.

The arm portions 122, 123G both extend in the z direction, and are arranged so as to sandwich the ring-shaped waveguide 124. In the arm portion 123G, the phase adjusting portion 112 is arranged. On the phase adjusting portion 112, the microheater 128 is formed. Although not illustrated, the arm portion 123G has a high mesa structure in which a lower cladding layer made from n-type InP, an optical waveguide layer made from InGaAsP, and an upper cladding layer made from p-type InP are laminated in this sequence on the semiconductor substrate S1. The SiN protection film is formed to cover the arm portion 123G. The microheater 128 is arranged along the optical waveguide layer of the phase adjusting portion 112 on the SiN protection film. Note that other components of the second waveguide portion 120G including the bifurcation portion 121, the arm portion 122, the ring-shaped waveguide 124 similarly have the high mesa waveguide structure, and are covered with the SiN protection film. The microheater 125 is in a ring shape, and is arranged on the SiN protection film formed to cover the ring-shaped waveguide 124.

The first waveguide portion 110G and the second waveguide portion 120G are optically connected to each other, and a waveguide layer having a diffraction grating of the waveguide portion 111b and the reflection mirror M2 constitute a laser resonator C2. Moreover, the gain portion 113, the SG-DBR 114, and the second waveguide portion 120G constitute the semiconductor laser.

In the wavelength-tunable laser device 200G, because the passive waveguide portion 150 and the passive waveguide electrode 153 can extract a leakage current from the SOA 140, broadening of the spectrum width can be prevented.

Also in the wavelength-tunable laser device 200G in which the two mirrors having lengths are the SG-DBR 114 and the ring resonator filter RF2, by arranging the passive waveguide portion 150 between the SOA 140 and the SG-DBR 114, broadening of the spectrum width caused by a leakage current can be suppressed.

According to an embodiment, an effect is produced that a flow of a leakage current from a semiconductor amplifier or the like into a mirror is suppressed, and a semiconductor optical integrated device having a narrow spectrum width can be implemented.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A semiconductor optical integrated device in which a semiconductor optical amplifier and a semiconductor laser are monolithically integrated on a semiconductor substrate, the semiconductor optical integrated device comprising:
   a passive waveguide portion arranged between the semiconductor optical amplifier and the semiconductor laser; and
   a ground electrode arranged on a lower surface of the semiconductor substrate, wherein
   the semiconductor laser is a wavelength-tunable laser and includes first and second mirrors each having length, a gain portion, and a phase adjusting portion, the second mirror being arranged on a side closer to the semiconductor optical amplifier,
   the second mirror is a distributed bragg reflector made from semiconductor,
   the semiconductor optical amplifier includes a semiconductor optical amplifier electrode on a side opposite to a side in contact with the semiconductor substrate,
   the passive waveguide portion includes a passive waveguide electrode on a side opposite to a side in contact with the semiconductor substrate,
   the passive waveguide electrode is electrically connected to the ground electrode,
   the passive waveguide portion is arranged between the second mirror and the semiconductor optical amplifier,
   the semiconductor laser and the semiconductor optical amplifier are optically connected via the passive waveguide portion,
   the second mirror, the semiconductor optical amplifier, and the passive waveguide portion are faced with a common upper cladding layer on a side opposite to a side in contact with the semiconductor substrate,
   the first mirror and the gain portion have a buried structure in which a stripe mesa structure is buried on both sides with a current blocking structure constituted of a p-type InP buried layer and a n-type InP current blocking layer,
   the common upper cladding layer on the buried structure is a common upper cladding layer in the first mirror and the gain portion,
   the second mirror is configured to be variable in wavelength characteristics by changing a refractive index of an optical waveguide layer of the second mirror by heating with a heater provided with the second mirror, and
   a leakage current from the semiconductor optical amplifier flows through the passive waveguide portion.

2. The semiconductor optical integrated device according to claim 1, wherein
a length of the passive waveguide electrode is shorter than a length of the passive waveguide portion.

3. The semiconductor optical integrated device according to claim 1, wherein
the passive waveguide electrode is arranged in the passive waveguide portion, avoiding right above the optical waveguide layer of the passive waveguide portion.

4. The semiconductor optical integrated device according to claim 1, wherein
a length of the semiconductor optical amplifier electrode is shorter than a length of an active core layer of the semiconductor optical amplifier, and the semiconductor optical amplifier electrode is not arranged on an end portion on a side closer to the passive waveguide portion of the active core layer.

5. The semiconductor optical integrated device according to claim 1, wherein
the passive waveguide portion includes a trench on a side closer to the semiconductor optical amplifier relative to the passive waveguide electrode.

6. The semiconductor optical integrated device according to claim 1, wherein
the first mirror is a distributed bragg reflector.

* * * * *